United States Patent [19]

Cheng

[11] Patent Number: 5,118,955
[45] Date of Patent: Jun. 2, 1992

[54] FILM STRESS MEASUREMENT SYSTEM HAVING FIRST AND SECOND STAGE MEANS

[75] Inventor: David Cheng, Santa Clara, Calif.

[73] Assignee: Ann Koo, San Jose, Calif.

[21] Appl. No.: 357,403

[22] Filed: May 26, 1989

[51] Int. Cl.$^5$ ............................................. G01V 9/04
[52] U.S. Cl. .................................... 250/561; 356/376
[58] Field of Search ............... 250/560, 561; 356/371, 356/376

[56] References Cited

U.S. PATENT DOCUMENTS

| | | | |
|---|---|---|---|
| 3,406,292 | 10/1968 | Geier et al. | 356/371 |
| 4,145,140 | 3/1979 | Fujii | 356/371 |
| 4,297,034 | 10/1981 | Ito et al. | 356/376 |
| 4,672,196 | 6/1987 | Canino | 250/560 |
| 4,815,857 | 3/1989 | Bragd | 356/376 |
| 4,900,940 | 2/1990 | Nakamura | 356/376 |

Primary Examiner—David C. Nelms
Assistant Examiner—Que T. Le
Attorney, Agent, or Firm—Burns, Doane, Swecker & Mathis

[57] ABSTRACT

A system for measuring the curvature of a surface includes a laser for emitting a beam of light to be incident upon the surface; a photodetector for detecting light reflected by the surface; a first stage for selectively moving the surface in a direction normal to the direction of the incident beam; a second stage for selectively moving the photodetector in a direction normal to the reflected beam; a sensor connected to the photodetector for detecting the displacement of the reflected beam relative to the photodetector.

20 Claims, 4 Drawing Sheets

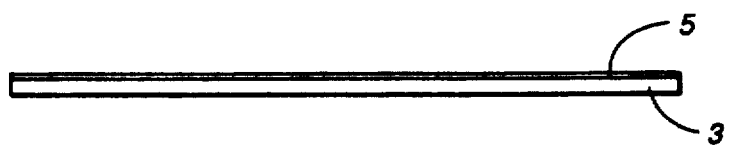
FIG._1A
FIG._1B
FIG._1C
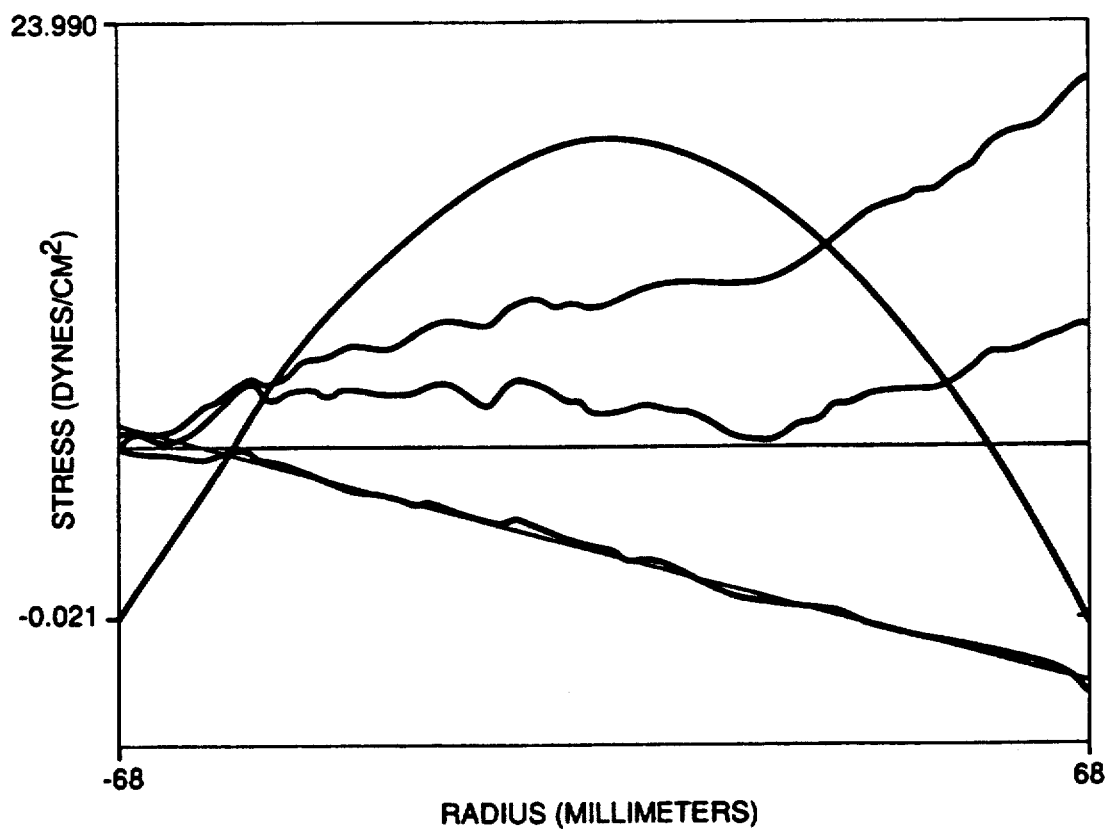
FIG._6

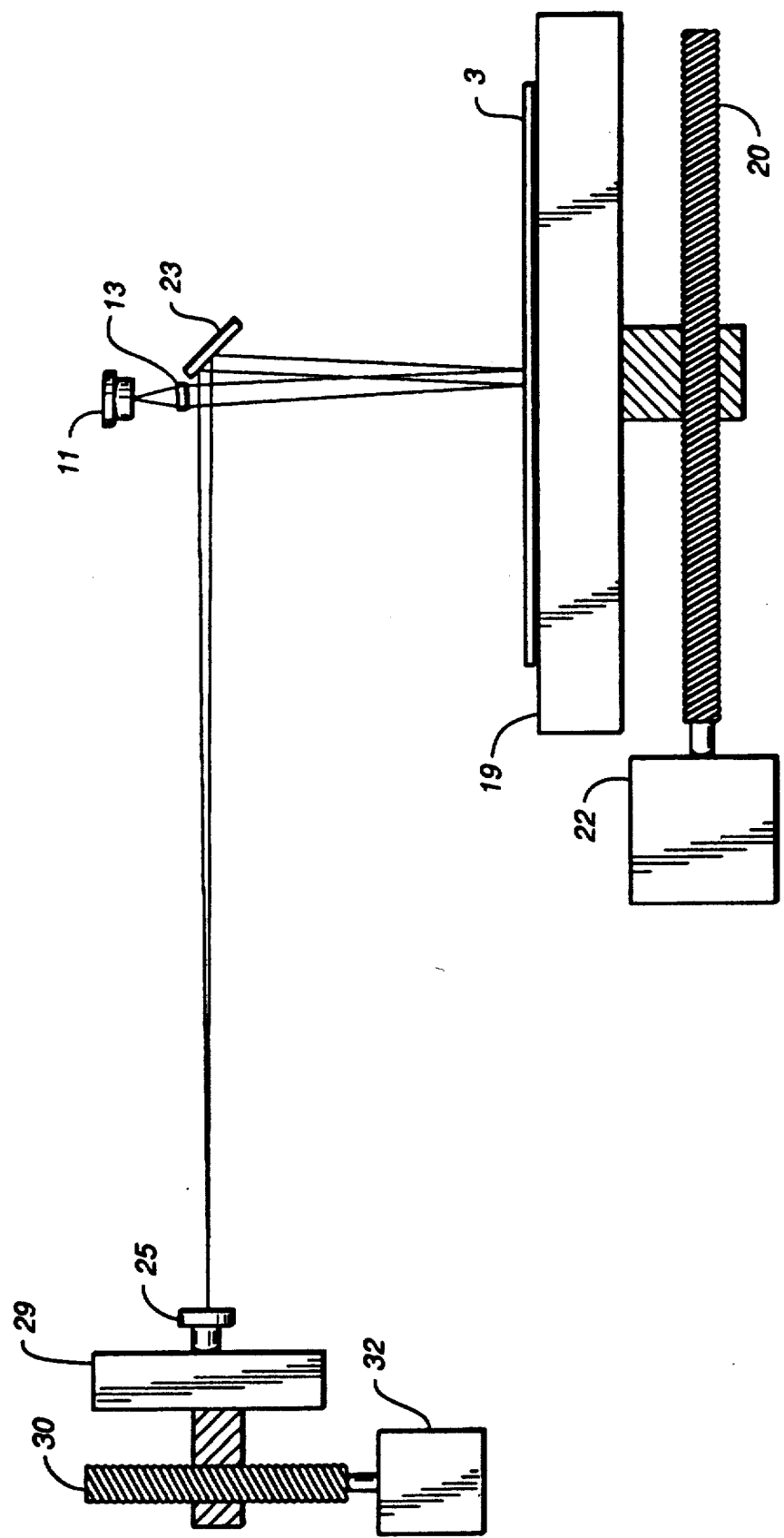
FIG._3

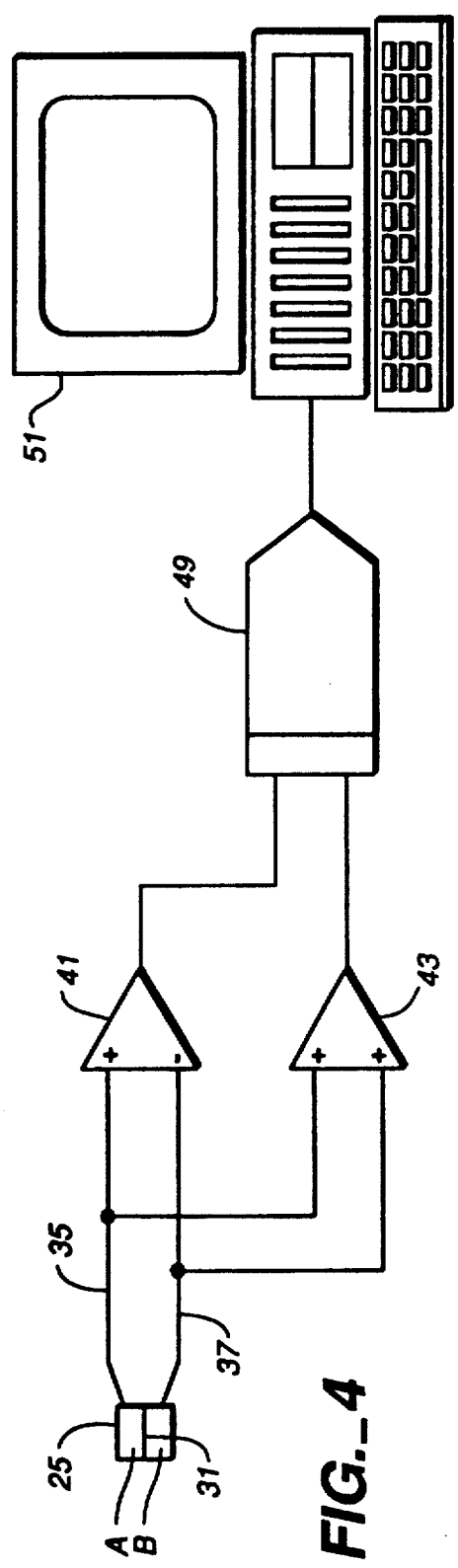
FIG._4
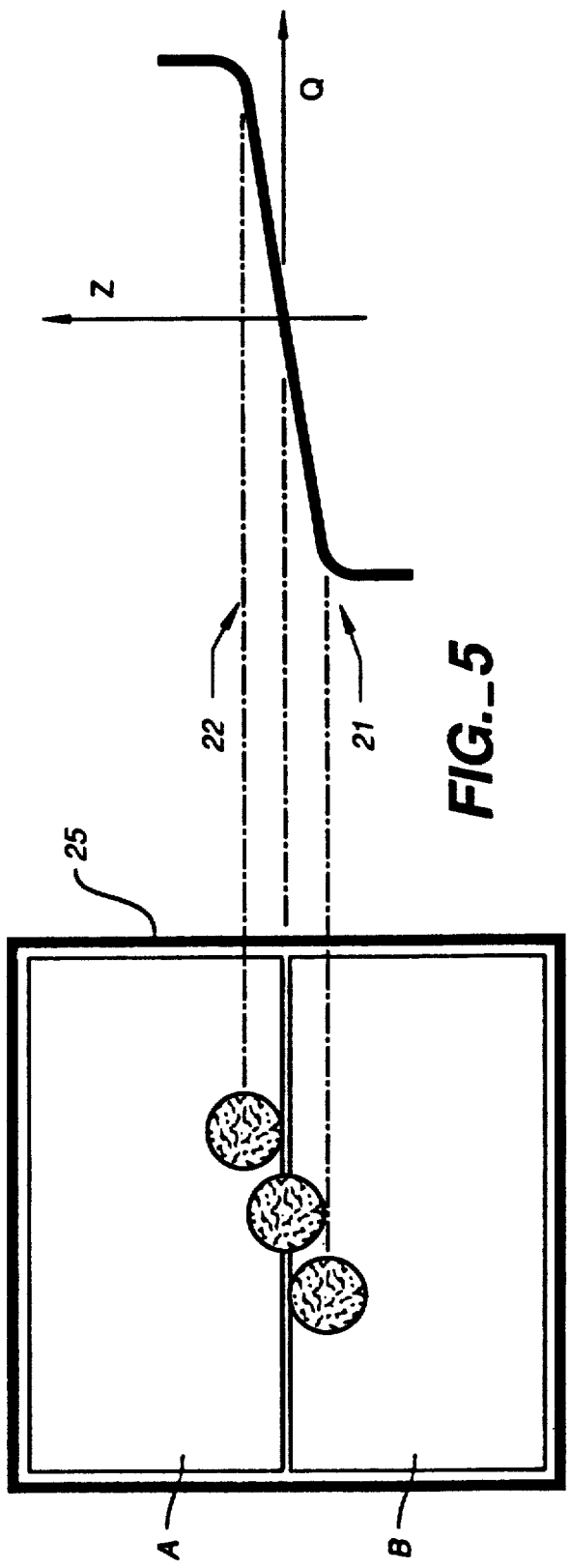
FIG._5

FILM STRESS MEASUREMENT SYSTEM HAVING FIRST AND SECOND STAGE MEANS

BACKGROUND OF THE INVENTION

1. Field of the Invention

The present invention generally relates to film stress measurement systems and, more particularly, to systems that measure stresses in thin films, such as dielectric or metal alloy films that are coated onto semiconductor wafers.

2. State of the Art

During the manufacture of semiconductor wafers that serve as substrates for integrated circuits, it is usual practice to form thin films onto the surfaces of the wafers. The surface films can comprise, for example, silicon dioxide, AlSi, Ti, TiN, PECVD Oxide, PECVD Oxynitride, Doped Glasses, silicides, and so forth. The thickness of such films usually ranges from about 500 to about 12,000 Angstroms. Often, three or more film layers are formed on the surface of a single semiconductor wafer.

In the art of fabricating semiconductor wafers, it is of known importance to minimize stresses in surface films. High surface stresses can cause, for instance, silicide lifting, the formation of voids or cracks and other conditions that adversely affect semiconductor devices (i.e., chips) which are fabricated on the wafers. In practice, surface stresses become more problematical as the level of circuit integration increases, and are especially troublesome when fabricating large-scale integration (LSI) and very large-scale integration (VLSI) semiconductor devices.

Generally speaking, the stress in the surface film of a semiconductor wafer can either be compressive or tensile. In physical terms, stresses of both types can cause slight changes in the surface curvature of a semiconductor wafer. That is, both compressive and tensile stresses can cause the surface of a semiconductor wafer to deviate from exact planarity. The extent of deviation from planarity often is expressed in terms of the radius of curvature of a wafer surface. Generally speaking, the greater the magnitude of surface stress, the smaller the radius of curvature. Conversely, small stress magnitudes are manifest in terms of large radii of curvature.

Because of the problems that can be caused by stresses in surface films on semiconductor wafers, it is highly desireable to measure such stresses. The measurements can be used, for instance, to identify wafers that are likely to provide low yields of semiconductor devices or to produce semiconductor devices that are prone to early failure. In normal practice, stresses in surface films are not measured directly but, instead, are inferred from measurements of the radius of curvature of the surface of interest.

Mathematically, surface film stress can be related to the radius of curvature of a semiconductor wafer by a function which involves Young's modulus for the silicon substrate portion of the wafer, the Poisson ratio for the substrate, the thickness of the substrate, the film thickness, and the radius of curvature of the wafer due to surface film stress. As a matter of convention, the radius the radius of curvature is understood to be negative for convex curvatures and positive for concave curvatures. That is, negative values of a radius of curvature indicate compressive stress and positive values indicate tensile stress.

In the drawings attached hereto, FIGS. 1A through 1C show the effects of surface film stresses on the curvature of a semiconductor wafer 3. More particularly, FIG. 1A depicts semiconductor wafer 3 having a single surface film layer 5 which is under no stress. FIG. 1B depicts the same wafer under the condition where the surface film 5 exerts tensile stress, resulting in the wafer surface having concave curvature. FIG. 1C depicts the wafer with the surface film exerting compressive stress, resulting in the wafer having convex curvature.

The practical difficulties in measuring stress levels in surface films can be appreciated by noting that the radius of curvature of a semiconductor wafer is often measured in kilometers, or even hundreds of kilometers. By way of comparison, the diameters of semiconductor wafers are measured in inches, and the depths of surface layer films are measured in terms of a fraction of a micron.

A known system for making laboratory measurements of surface curvatures of semiconductor wafers is shown in FIG. 2. In the system, a beam of laser light is directed onto the surface of a semiconductor wafer and the reflected light is projected as a spot onto a screen. If the wafer surface deviates from exact planarity (i.e., has a radius of curvature), the location at which the reflected light strikes the screen will change as the wafer is moved perpendicularly to the beam (i.e., in the x-direction). Thus, by measuring both the distance that a wafer is moved and the resulting distance that the beam of reflected light moves on the screen, the wafer's radius of curvature can be determined.

In mathematical terms, the radius of curvature of a wafer can be related to measurements provided by the system of FIG. 2 as follows:

$$R = 2L(dx/dd) \tag{1}$$

where dx is the distance of translation of the wafer, dd is the resulting translation of the spot formed by the reflected beam on the screen, and L is the distance traveled by the reflected beam. In the system shown, the beam travel distance is about ten meters (i.e., $L = 10$ meters). Further details concerning the system are provided in an article entitled "Thermal Stresses and Cracking Resistance of Dielectric Films on Si Substrates," A. K. Sinha et. al., Journal of Applied Physics, vol. 49, pp. 2423-2426, 1978.

Systems such as shown in FIG. 2 are often referred to as optically levered systems. Normally, calibration of such systems requires use of standard reference surfaces. Typically, one of the reference surfaces is assumed to be perfectly flat, and another of the reference surfaces has a predetermined radius of curvature.

SUMMARY OF THE INVENTION

Generally speaking, the present invention provides a self-calibrating system for measuring the curvature of a surface. In the preferred embodiment, the system includes a laser for emitting a beam of light to strike the surface to be measured; a photodetector for detecting a beam of light reflected by the surface; a first stage for selectively moving the surface in a direction normal to the direction of the incident beam; a second stage for selectively moving the photodetector in a direction normal to the direction of the reflected beam for purposes of calibration; and a position sensor connected for detecting displacement of the reflected beam on the photodetector resulting from selective movement of the first stage. In practice, a microprocessor-based computer is connected to the position sensor for making computations of measures of the surface in response to sensed displacements of the first and second stages and sensed displacement of the reflected beam on the photodetector.

BRIEF DESCRIPTION OF THE DRAWINGS

The present invention can be further understood by reference to the following description and attached drawings which illustrate the preferred embodiment of the invention. For purposes of clarity, identical parts are given the same reference numbers in the various drawing figures. In the drawings:

FIGS. 1A through 1C are diagrams that show, to a highly exaggerated scale, semiconductor wafers under three different surface stress conditions;

FIG. 3 shows a surface curvature measurement system according to the present invention;

FIG. 4 is a schematic diagram of an electrical circuit for use with the measurement system of FIG. 3;

FIG 5 is a graph which is provided to assist in illustrating the operation of the system of FIG. 3; and FIG. 6 is a graph showing examples set of measurements provided by the system of FIG. 3.

DETAILED DESCRIPTION OF THE PREFERRED EMBODIMENT

Figure 2:
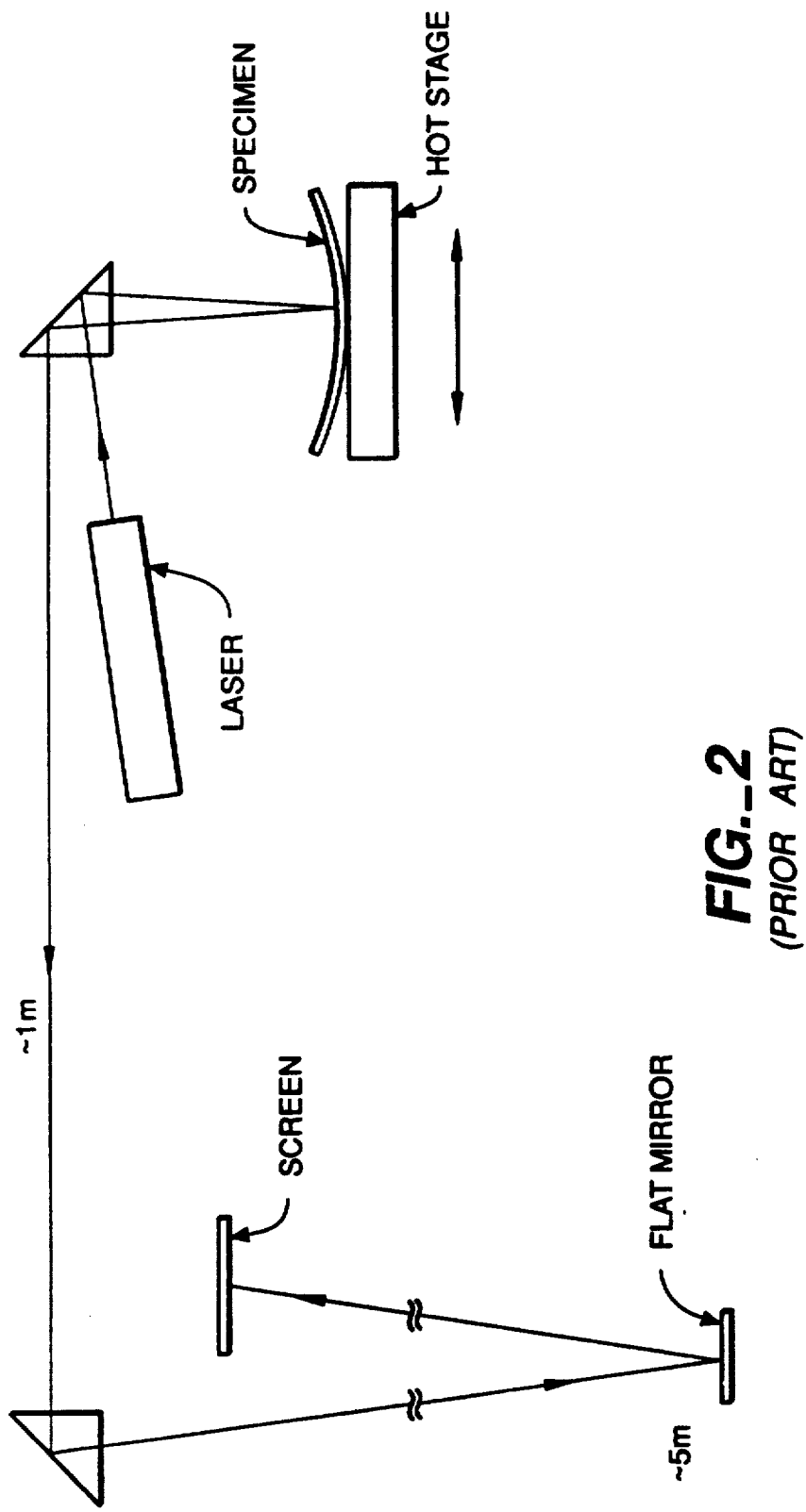
FIG. 2 is a schematic diagram of a system for wafer surface curvature measurements according to the prior art.

The wafer surface curvature measurement system in FIG. 3 generally comprises a diode laser 11 that provides a beam of light from a laser junction, a lens 13 for causing convergence of the beam toward the surface of a semiconductor wafer 3, a stage 19 for supporting and selectively translating the wafer in a single direction (e.g., the x-direction), a mirror 23 for directing a beam of light that has been reflected from the wafer surface, and a photodetector 25 for detecting the position of the beam of light that has been reflected by mirror 23. Photodetector 25 is mounted to a second stage mechanism, generally designated by the number 29, which selectively moves (i.e., translates) the photodetector in a direction perpendicular to the reflected beam. For instance, if the path of the reflected light is assumed to coincide with the x-direction, then translation mechanism 29 can be understood to move photodetector 25 the z-direction (i.e., upwardly or downwardly relative to the horizontal). In practice, the beam path length for the system of FIG. 3 is about three-hundred millimeters.

In the preferred embodiment of the system of FIG. 3, movement of wafer stage 19 is accomplished by a lead screw 20 driven by a stepper motor 22. Both lead screw 20 and stepper motor 22 are conventional components. The stepper motor has the characteristic that it can be operated to advance stage 19 in discrete, reproducible increments. In practice, such increments result in advancing or retracting the stage in the x-direction in incremental distances of about 0.025 millimeters.

Further in the preferred embodiment of the system of FIG. 3, second stage 29 is selectively moveable in the z-direction by a lead screw 30 driven by a stepper motor 32. Here again, the stepper motor has the characteristic that it can advance the stage in discrete, reproducible increments. In practice, stage 29 is advanced in the z-direction in increments of about 0.6 microns.

FIG. 4 shows photodetector 25 connected in an electrical circuit for sensing displacement of the beam of reflected light. Generally speaking, the photodetector is a conventional device such as a silicon PIN diode. As indicated by line 31, the light-receiving surface of photodetector 2 is bifurcated. In practice, the bifurcation is accomplished by constructing the photodetector of two separate PIN diodes such that detection signals are separately available from each of the diodes. For purposes of discussion, the portion of photodetector 25 on one side of line 31 is designated by the letter A, and the portion of the detector on the other side of the line is designated by the letter B. A conductor 35 is connected to provide output electrical signals from detector portion A and, similarly, a conductor 37 is connected to provide electrical output signals from detector portion B.

In operation of photodetector 25 of FIG. 4, output signals are provided on conductor 35 if the reflected beam is incident on detector portion A. Likewise, electrical signals are provided on conductor 37 if the reflected beam is incident on detector portion B. Also, output signals will be provided from both detectors A and B if the spot of the reflected beam strikes (i.e., overlaps) line 31. The electrical output signals on conductors 35 and 37 are analog signals in that sense that their amplitudes vary with the intensity of the reflected beam and the size of the spot which the beam projects onto the detectors.

Further in the circuit of FIG. 4, conductor 35 is connected to the positive input of a differential-voltage operational amplifier 41, and conductor 37 is connected to the negative input of the amplifier. Also, conductors 35 and 37 are separately connected to the inputs of a summing amplifier 43. In practice, both operational amplifier 41 and summing amplifier 43 are conventional devices. In practice, the summing amplifier can be embodied as an operational amplifier with an invertor at its negative input terminal.

Still further in the circuit of FIG. 4, output signals from amplifiers 41 and 43 are provided to a computer interface circuit 49 consisting primarily of an analog-to-digital converter. The converter functions to convert the analog signal values to digital (i.e., discrete) values. The output of interface circuit 49 is connected to a conventional microprocessor-based digital computer 51 where the digital values are stored in the computer's memory. The stored digital values can be manipulated in accordance with algorithms as described below to provide measurements of the radius of curvature of a surface such as the surface of a semiconductor wafer.

Operation of the circuit of FIG. 4 can be further understood by reference to FIG. 5, wherein the graph depicts the following function:

$$diff = A - B. \qquad (2)$$

In equation (2), the letter A represents the signal amplitude on conductor 35 (i.e., the magnitude of the signal from detector A within photodetector 25), and the letter B represents the signal amplitude on conductor 37 (i.e., the magnitude of the signal from detector B). In other words, equation (2) represents the output of operational amplifier 41.

For purposes of discussion of the operation of the system of FIG. 4, it can be assumed that the reflected beam initially strikes only detector A within photodetector 25. Further for purposes of simplifying the discussion, it can be assumed that amplifier 41 has unity gain. Under those assumptions, the value of the function of equation (2) will equal the magnitude of signal A (i.e., diff=A). On the other hand, if the reflected beam strikes only detector B within photodetector 25, the value of the function will equal the negative of the magnitude of signal B (i.e., diff= −B). Both situations are shown graphically in FIG. 5.

In situations where the reflected beam simultaneously strikes detectors A and B in the circuit of FIG. 4, the value of equation (2) will equal the quantity A-B, where the magnitudes of signals A and B are proportional to the cross-sectional area of the beam spot which strikes detectors A and B, respectively, as the beam spans line 31. In other words, the output of operational amplifier 41 in such circumstances equals the magnitude of signal A minus the magnitude of signal B. It should be noted that the magnitude of the amplifier output decreases generally monotonically as the beam spot traverses line 31 from detector A to detector B.

In the following, there will be further discussion of the rate of change of the quantity (A − B) with respect to movement of the reflected beam in the z-direction.

Referring still to FIG. 4, it can be appreciated that summing amplifier 43 can be used to normalize the output of differential amplifier 41. More particularly, the output of differential amplifier 41 can be divided by the output of summing amplifier 43 to provide the following function, Q:

$$Q = (A - B)/(A + B). \quad (3)$$

The operation of division indicated by the equation could be implemented by hardware (i.e., by a divider circuit), but is more conveniently implemented in software within computer 51. As a result of such a normalization operation, measurements provided by the system of FIG. 3 can be made insensitive to beam intensity, to changes in the reflectivity from the wafer surface, to signal drift and other environmental factors.

For calculations based upon information provided by the system of FIG. 3, the measurement region of interest is usually only a portion (e.g., ten percent) of the region bounded by lines z1 and z2 in FIG. 5. Within that region, the amplitude of the quantity (A−B) changes generally linearly with changes in displacement in the z-direction. In practice, the approximation to linearity is most exact for a limited range of values about the point where the signal amplitude function intersects the z axis. As will be further discussed below, this linear relationship allows the radius of curvature of a semiconductor wafer to be measured with high accuracy but in a simple manner.

Complete operation of the measurement system of FIG. 3 can now be understood. Initially, it should be assumed that wafer 3 is held stationary on stage 19. For calibration purposes, stage 29 is driven in the z-direction by stepper motor 32, thereby causing detector 25 to move across the beam reflected from mirror 23. As stage 29 is driven in the z-direction, its displacement is monitored via stepper motor 32. Then, the magnitude of the function Q can be detected at the output of the circuit of FIG. 4 to provide a measure of the change in the value of Q as a function of relative displacements between stage 29 and the reflected beam. In other words, knowledge of changes in function Q with discrete z-direction displacements of stage 29 enables a function dQ/dZ to be calculated. (In essence, this function expresses the slope of the normalized version of the graph of FIG. 5 within the limits of the lines z1 and z2.) In turn, calculation of the function dQ/dZ allows the measurement system of FIG. 3 to be calibrated since the function dQ/dZ identifies the change in the output of the circuit of FIG. 4 resulting from a change in the position of the reflected laser beam.

At this juncture, it can be appreciated that the system of FIG. 3 is self-calibrating and that no external "standards" are required. Further, it can be appreciated that the selectively-moveable stage 29 is necessary for calibration of the system as well as to extend its range of operation.

After calibration of the system of FIG. 3 is accomplished, measurements of the surface curvature of a specimen on stage 19 can be readily made. To make such measurements, stage 19 is selectively translated in the x-direction while laser diode 11 and photodetector 25 are held stationary. If there is any curvature to the surface of the specimen, such curvature will cause a change in the location at which the reflected beam strikes photodetector 25 and, in turn, will cause changes in the system output signal (e.g., function Q). The change in location at which the reflected beam strikes photodetector 25 can be computed by using the value of the function dQ/dZ as determined during calibration.

For example, if it is assumed that dQ/dz=s, where s is a constant determined during calibration, then $$zb = Q/s \quad (4)$$

where zb is the beam position on the detector relative to line 31, and Q is the normalized output of the circuit of FIG. 4.

After a beam displacement distance zb has been detected for a given displacement zs of stage 19, equation (1) can be employed to determine the radius of curvature of the surface of a specimen on the stage. Then, known equations can be used to calculate the surface stress as manifested by the radius of curvature.

At this juncture, it can be appreciated that measurements of curvature provided by the system of FIG. 3 will be quite accurate as long as the reflected beam is incident within the limits z1 and z2 as described earlier. In the event that displacement of stage 19 results in the reflected beam moving beyond one of the limits z1 or z2, stage 29 can be controllably re-positioned by stepper motor 32 such that the reflected beam remains within the range of detector 25 (i.e., between limits z1 and z2). Thus, the system of FIG. 3 provides very fast and accurate measurements as well as a large operating range limited defined by the travel range of stage 29.

Although a radius of curvature for a surface such as the surface of a semiconductor wafer could be calculated by detecting only two discrete data points with the system of FIG. 3, it is preferred to calculate a large number of radii of curvatures for a given surface. In practice, this is accomplished by moving stage 19 sufficiently far in the x-direction that the incident laser beam traverses a surface from edge to edge while a large number (e.g., one-thousand) data points are taken during the scan. Accordingly, a large number of values for radii of curvature can be calculated for each such scan. It may be appreciated that the radii values may not all be exactly equal. Differences in radii values can arise, for example, because of non-uniformities in film thickness, because of changes in film composition across a wafer, because of variations in the thickness of the substrate (i.e., the wafer thickness), and because of random measurement errors.

In practice, measurements obtained by the system of FIG. 3 usually are operated upon by statistical techniques to enhance the accuracy of the measurements. Particularly, it is usually helpful to perform a least-squares fit analysis of measurements for a number of locations across a specimen. Such analysis is beneficial because, for instance, calculated values for a radius of curvature can vary dramatically with small variations in beam displacement measurements.

Also in practice, it is often desireable to scan a wafer with the system of FIG. 3 both before and after surface layers are deposited upon the wafer. This allows determination of, for instance, changes of the radius of curvature caused by a film deposition process.

FIG. 6 shows an example of a group of measurements that can be provided by the system of FIG. 3 for scans of a semiconductor wafer both before and after a film is deposited upon the wafer surface. In the graph of FIG. 6, the values on the vertical axis represent displacement distance in the z-direction. Values on the horizontal axis represent x-direction displacements of an incident beam across a surface to be measured.

As indicated in FIG. 6, one of the curves depicts measurements of the surface of a blank wafer, and another of the curves depicts measurements after the deposition of a film on the wafer surface. The third curve in the graph depicts the difference between the pre and post deposition scans for locations across the wafer surface. Superimposed upon the third curve is a line showing a least-squares fit of the data points. The fourth curve graphically shows the surface topography and depicts the curvature of the wafer due to stress.

At this juncture, it can be understood that graphs such as the ones in FIG. 6 can be calculated for portions of a scan across a surface as well as for a complete scan. That is, measurement data can be calculated and displayed for a local area on a wafer's surface. Such practice is referred to as a "window" capability. With the windowing capability, a user of the measurement system can select certain locations along a scan and then recalculate film stresses for the selected locations. Such calculations will then only reflect local surface conditions and, as such, can be employed to isolate local non-uniformities caused, for instance, by variations in film thickness, film composition, or substrate thickness.

Further, it can be understood that the system of the present invention can be operated to detect the topography of a wafer in two directions (e.g., in the x-y plane). This is accomplished by providing, for example, by providing a wafer stage which is selectively rotatable by ninety degrees in the x-y plane. Then, by selective displacement of an inspected wafer in the x- and y-directions, radii of curvature in both directions can be measured. Similarly, the photodetector stage 29 may be made to move in two dimensions if desired.

The above-described system can also be used to measure topographical characteristics of wafers whose surfaces have been patterned. Most frequently, the surface patterns are formed as a result of fabrication of integrated circuits upon the wafers. When patterns are formed on a wafer surface, the pattern lines may act as diffraction gratings with respect to incident light and diffract the light away from the ray path that the light would have followed in the absence of the pattern lines (i.e., the nominal path). Thus, pattern lines on the surface of a semiconductor wafer can be said to cause deviation from the nominal reflection path. Typically, the deviations from the nominal paths are random.

Although it was often desired to measure the curvature of the surface of a semiconductor wafer after integrated circuits had been formed on the wafer, heretofore the above-described diffraction effects prevented optical methods from being used to make the measurements. However, the system of the present invention can be used to measure the surface curvature of even such wafers. This is possible because of the large number of data points which the system can accumulate during a single scan of a wafer and the concomitantly large number of radii of curvature which can be calculated. When such a large number of radii of curvature are averaged with one another, the resultant mean value for the radius of curvature is highly accurate for the wafer as a whole. That is, the random diffraction effects tend toward a value of zero for a large number of samples.

In use, measurement systems such as the one described above can provide measurements of surface stress to resolutions better than about $5 \times 10^6$ dynes per square centimeter for wafers with film thicknesses of about one micrometer.

The foregoing has described the principles, preferred embodiments and modes of operation of the present invention. However, the invention should not be construed as limited to the particular embodiments discussed. For example, the system of the present invention is not limited to measuring the curvature of semiconductor wafers, but can be used to measure surface curvatures of magnetic disks such as are used for the magnetic recording of binary data in microprocessor-based computers. Also, the system of the present invention can be used to measure the surface curvature of so-called optical disks. The measurements may be used, for instance, to detect ones of such disks which have relatively high surface curvatures and, hence, are likely to experience surface layer peeling or cracking. Thus, the above-described embodiments should be regarded as illustrative rather than restrictive, and it should be appreciated that variations may be made in those embodiments by workers skilled in the art without departing from the scope of present invention as defined by the following claims.

What is claimed is:

1. A system for measuring the curvature of a surface of a semiconductor wafer, comprising:
   a) laser means and lens means for directing a beam of light for incidence on the surface of a wafer whose surface curvature is to be measured;
   b) photodetector means for detecting a position of the laser light beam reflected from the surface;
   c) first stage means for selectively moving the semiconductor wafer in a direction which is normal to the direction of the incident beam, so that the incident beam scans across the wafer surface;
   d) second stage means for selectively moving the photodetector means in a direction which is normal to the direction of the reflected beam;
   e) position sensing means connected to the photodetector means for detecting the location on the photodetector means at which the reflected beam is incident; and
   f) means for determining the curvature of the surface of the semiconductor wafer based upon the displacement of the reflected beam on the photodetector means relative to changes in position of the first and second stage means.

2. The system according to claim 1 further including computer means connected to the position sensing means for computing the displacement of the reflected beam on the photodetector means relative to changes in position of the first and second stage means.

3. The system according to claim 2 wherein the photodetector means includes first and second photodetecting diodes for separately providing electrical output signals that indicate the position of the reflected beam.

4. The system according to claim 3 further including an operational amplifier connected to subtract electrical signals provided by the first photodetecting diode from electrical signals provided by the second photodetecting diode.

5. The system according to claim 3 further including analog-to-digital converter means connected to convert the outputs of the first and second photodetecting diodes to digital signals for computational use by the computer means.

6. The system according to claim 5 wherein the computer mean computes the radius of curvature, R, of the wafer surface in accordance with the following equation:

$$R = 2L(dx/dz)$$

where dx is the distance of translation of the wafer by the first stage means, dz is the resulting translation of the spot formed by the reflected beam, and L is the distance travelled by the beam.

7. The system according to claim 6 wherein the computer means computes stresses for a multiplicity of locations on the wafer surface.

8. The system according to claim 1 wherein the first and second stage means include drive means for driving the stage means incrementally, and sensor means for sensing the incremental displacements of the respective stage means.

9. The system according to claim 8 wherein each of the drive means comprises a lead screw and a stepper motor connected for driving the lead screw incrementally.

10. The system according to claim 9 further including sensing means to sense the displacement of the first and second stage means.

11. A system for measuring the curvature of a surface, comprising:
  a) laser means for emitting a beam of light and lens means for directing the beam onto the surface whose curvature is to be measured;
  b) photodetector means for detecting light reflected by the surface from the beam;
  c) first stage means for selectively moving the surface in a direction normal to the direction of the reflected beam;
  d) second stage means for selectively moving the photodetector means in a direction normal to the direction of the reflected beam; and
  e) position sensing means connected to the photodetector means for detecting the displacement of the reflected light on the photodetector resulting from selective movement of the first and second stage means.

12. The system according to claim 11 further including computer means connected to the position sensing means for computing the displacement of the reflected beam on the photodetector means for changes in position of the first and second stage means.

13. The system according to claim 11 wherein the photodetector means is comprised of first and second photodetecting diodes, and the position sensing means comprises means for subtracting electrical signals provided by the first photodetecting diode from electrical signals provided by the second photodetecting diode.

14. The system according to claim 13 wherein the means for subtracting comprises a differential voltage operational amplifier.

15. The system according to claim 13 further including an analog-to-digital converter means connected to the output of the means for subtracting for converting the signals therefrom to digital signals.

16. The system according to claim 15 wherein the output of the analog-to-digital converter means is connected to said computer means.

17. An improved method for measuring the curvature of a surface with an optically levered system, comprising the steps of:
  directing a generally converging beam of light for incidence on the surface whose curvature is to be measured;
  with first and second selectively movable photodetectors, receiving light reflected from the surface;
  selectively moving the surface;
  then, detecting the displacement of the reflected light relative to the first and second photodetectors; and
  based upon the detected displacement, computing the radius of curvature of the reflecting surface.

18. The method according to claim 17 further including the step of computing stress on the reflected surface as a function of the computed radius of curvature.

19. The method according to claim 18 further including the step of scanning across the reflecting surface and, for a large number of discrete locations along the scan, computing radii of curvature for the surface, and then computing the mean value of the computed radii.

20. A film stress measurement system comprising:
  a) laser means for emitting light from a laser junction;
  b) lens means for directing the beam onto the surface of a wafer whose surface curvature is to be measured;
  c) photodetector means for detecting a position of the laser light beam reflected from the surface, the photodetector means including first and second photodetecting diodes for separately providing electrical output signals that indicate the position of the reflected beam;
  d) first stage means for selectively moving the semiconductor wafer in a direction which is normal to the direction of the incident beam, so that the incident beam scans across the wafer surface;
  e) second stage means for selectively moving the photodetector means in a direction which is normal to the direction of the reflected beam;
  f) position sensing means connected to the photodetector means for detecting the location on the photodetector means at which the reflected beam is incident; and
  g) means for determining the curvature of the surface of the semiconductor wafer based upon the displacement of the reflected beam on the photodetector means relative to changes in position of the first and second stage means.

* * * * *